United States Patent
Kim et al.

(10) Patent No.: US 11,011,562 B2
(45) Date of Patent: May 18, 2021

(54) IMAGE SENSOR

(71) Applicant: Samsung Electronics Co., Ltd., Suwon-si (KR)

(72) Inventors: Changhwa Kim, Hwaseong-si (KR); Kwan Sik Kim, Seoul (KR); Sang Su Park, Seoul (KR); Beom Suk Lee, Yongin-si (KR); Man Geun Cho, Suwon-si (KR); Min Jun Choi, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/402,423

(22) Filed: May 3, 2019

(65) Prior Publication Data
US 2020/0075650 A1   Mar. 5, 2020

(30) Foreign Application Priority Data
Sep. 5, 2018   (KR) .................. 10-2018-0105718

(51) Int. Cl.
| | |
|---|---|
| *H01L 27/30* | (2006.01) |
| *H01L 27/146* | (2006.01) |
| *H04N 5/3745* | (2011.01) |
| *H01L 27/142* | (2014.01) |

(52) U.S. Cl.
CPC ...... *H01L 27/14621* (2013.01); *H01L 27/142* (2013.01); *H01L 27/14605* (2013.01); *H04N 5/37455* (2013.01)

(58) Field of Classification Search
None
See application file for complete search history.

(56) References Cited

U.S. PATENT DOCUMENTS

| | | | |
|---|---|---|---|
| 9,402,315 B2 | 7/2016 | Chun et al. | |
| 9,780,130 B2 | 10/2017 | Suh et al. | |
| 9,882,154 B2 | 1/2018 | Yamaguchi | |
| 2012/0153127 A1* | 6/2012 | Hirigoyen | ......... H01L 27/14609 250/208.1 |
| 2013/0087682 A1* | 4/2013 | Nomura | ................ H01L 31/103 250/206 |

(Continued)

FOREIGN PATENT DOCUMENTS

| | | |
|---|---|---|
| JP | 2010-062380 | 3/2010 |
| JP | 2016-127264 | 7/2016 |

(Continued)

*Primary Examiner* — Joseph C. Nicely
*Assistant Examiner* — Lamont B Koo
(74) *Attorney, Agent, or Firm* — Myers Bigel, P.A.

(57) ABSTRACT

An image sensor includes a substrate having a photoelectric conversion element therein, a first via extending into a first surface of the substrate such that a first upper surface of the first via is exposed adjacent the first surface of the substrate, a second upper surface of the first via extending away from the first surface of the substrate, first to third insulating films sequentially stacked on the first surface of the substrate, and a contact extending through the first to third insulating films and into the second upper surface of the first via. The contact includes a first portion within the first via, a second portion in the first insulating film, a third portion in the second insulating film, and a fourth portion in the third insulating film.

20 Claims, 18 Drawing Sheets

(56) References Cited

U.S. PATENT DOCUMENTS

| | | | |
|---|---|---|---|
| 2014/0263962 A1* | 9/2014 | Ahn | .................... H01L 27/1464 250/208.1 |
| 2017/0170238 A1 | 6/2017 | Lee et al. | |
| 2018/0190696 A1 | 7/2018 | Lee et al. | |
| 2018/0240847 A1 | 8/2018 | Ota et al. | |

FOREIGN PATENT DOCUMENTS

| | | |
|---|---|---|
| JP | 2017-174936 | 9/2017 |
| KR | 10-2017-0124548 | 11/2017 |

\* cited by examiner

IMAGE SENSOR

CROSS-REFERENCE TO RELATED APPLICATION

This application claims priority to Korean Patent Application No. 10-2018-0105718, filed on Sep. 5, 2018, and all the benefits accruing therefrom under 35 U.S.C. § 119, the disclosure of which is incorporated herein by reference in its entirety.

BACKGROUND

An image sensor is a device that converts optical images into electrical signals. Image sensors may be categorized into charge coupled device (CCD) types, and a complementary metal oxide semiconductor (CMOS) types. CMOS type image sensors may also be referred to as 'CIS' (CMOS image sensors). A CIS may include a plurality of 2-dimensionally arranged pixels. Each of the pixels may include a photodiode (PD). The photodiode may function to convert incident light into electrical signals.

With development in the computer and the communication industries, demand has increased for the image sensors with enhanced performances in a variety of fields such as digital cameras, camcorders, personal communication systems (PCS), gaming devices, security cameras, medical micro cameras, robots, and so on. Further, highly-integrated semiconductor devices may allow for high integration of the image sensor.

SUMMARY

Some embodiments of the present disclosure provide an image sensor with enhanced reliability by securing misalignment margins between a contact disposed on a substrate and a via disposed within the substrate.

Some embodiments of the present disclosure provide an image sensor with enhanced reliability by reducing resistance between a contact and a lower electrode as a width of a contact disposed on a substrate increases.

Some embodiments of the present disclosure provide an image sensor with enhanced reliability by reducing resistance between a contact and a via, as a contact disposed on a substrate extends within a via disposed within a substrate.

According to an example embodiment of the present disclosure, there is provided an image sensor, comprising a substrate whose internal portion is disposed with a photoelectric conversion element, a first via penetrating through a first surface of the substrate and exposing a first upper surface on the first surface of the substrate, a second upper surface of the first via extending away from the first surface of the substrate, first to third insulating films sequentially stacked on the first surface of the substrate, and a contact penetrating through the first to third insulating films and extending into the second upper surface of the first via, comprising a first portion disposed within the first via, a second portion disposed in the first insulating film, a third portion disposed in the second insulating film, and a fourth portion disposed in the third insulating film.

According to an example embodiment of the present disclosure, there is provided an image sensor, comprising a substrate whose internal portion is disposed with a photoelectric conversion element, a via penetrating through a first surface of the substrate and exposing a first upper surface on the first surface of the substrate, a second upper surface of the via extending away from the first surface of the substrate, first and second insulating films sequentially stacked on the first surface of the substrate, and a contact penetrating through the first and second insulating films and extending into the second upper surface of the via, comprising a first portion disposed within the via, a second portion disposed in the first insulating film, and a third portion disposed in the second insulating film, wherein a first slope profile of a sidewall of the first portion is different from a second slope profile of a sidewall of the second portion.

According to an example embodiment of the present disclosure, there is provided an image sensor, comprising a substrate whose internal portion is disposed with a photoelectric conversion element, a via penetrating through a first surface of the substrate and exposing a first upper surface on the first surface of the substrate, a second upper surface of the via extending away from the first surface of the substrate, first and second insulating films sequentially stacked on the first surface of the substrate, a color filter disposed within the second insulating film, and a contact penetrating through the first and second insulating films and extending into the second upper surface of the via, comprising a first portion disposed within the via, a second portion disposed in the first insulating film, a third portion disposed in the second insulating film, and a fourth portion disposed on the second insulating film, wherein a portion of a lower surface of the fourth portion in contact with the second insulating film.

The objectives that are intended to be addressed by the present disclosure are not limited to those mentioned above, and other objectives that are not mentioned above may be clearly understood to those skilled in the art based on the description provided below.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings, in which.

DETAILED DESCRIPTION

Hereinbelow, an image sensor according to some example embodiments will be described with reference to FIG. 1.

Figure 1:
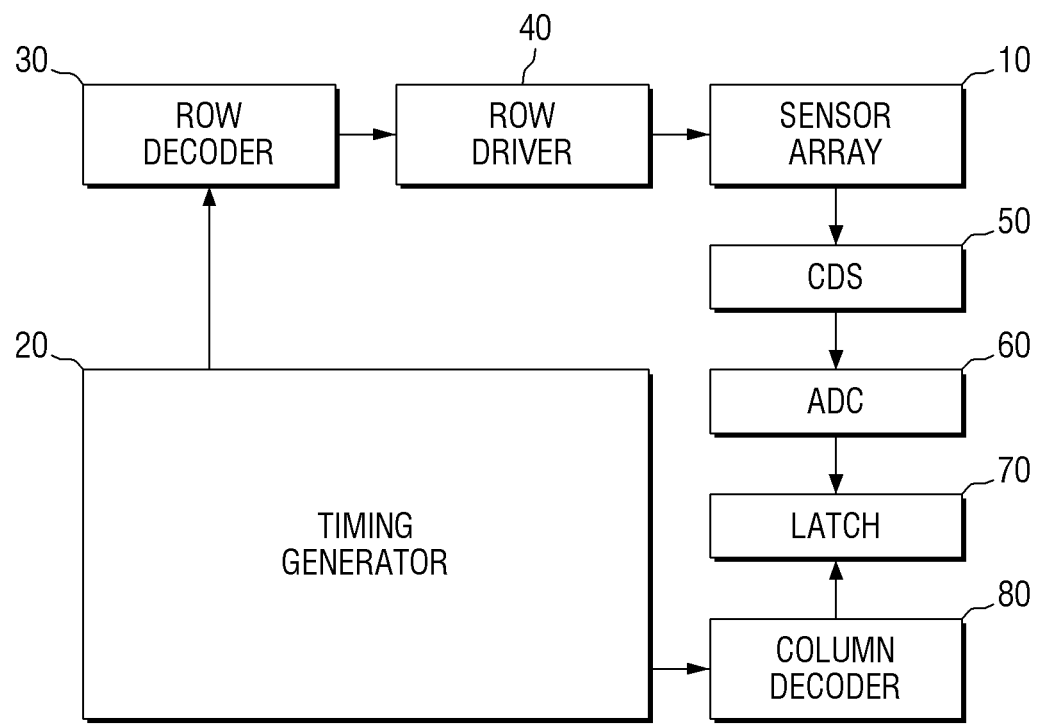
FIG. 1 is a block diagram of an image sensor according to some example embodiments.

FIG. 1 is a block view of an image sensor according to some example embodiments.

Referring to FIG. 1, an image sensor according to some example embodiments includes an active pixel sensor array 10 composed of 2-dimensionally arranged pixels including photoelectric conversion elements, a timing generator 20, a row decoder 30, a row driver 40, a correlated double sampler (CDS) 50, an analog to digital converter (ADC) 60, a latch 70, and a column decoder 80.

The active pixel sensor array 10 includes a plurality of 2-dimensionally arranged unit pixels. A plurality of unit pixels may perform a function of converting an optical image into an electrical output signal.

The active pixel sensor array 10 may receive a plurality of driving signals including row-select signal, reset signal, charge transfer signal, and so on from the row driver 40 and may be driven accordingly. Further, the converted electrical output signal may be provided to the correlated double sampler 50 through signal lines (e.g., vertical signal lines).

The timing generator 20 may provide a timing signal and a control signal to the row decoder 30 and the column decoder 80.

The row driver 40 may provide a plurality of driving signals to the active pixel sensor array 10 for driving a plurality of unit pixels according to a result of decoding at the row decoder 30. |The driving signals may be provided to each of the rows when the unit pixels are arranged in a matrix form.

The correlated double sampler 50 may receive an output signal generated at the active pixel sensor array 10 through a vertical signal line, and hold and sample the received signal. That is, the correlated double sampler 50 may double-sample a certain noise level and a signal level according to the output signal, and output a difference level corresponding to a difference between the noise level and the signal level.

The analog to digital converter 60 may convert an analog signal corresponding to the difference level into a digital signal, and output the result of conversion.

The latch 70 may latch the digital signal, and the latched signal may be output to an image signal processor sequentially according to the result of decoding at the column decoder 80.

Hereinafter, an equivalent circuit diagram of a sensor array according to some example embodiments will be described with reference to FIG. 2.

Figure 2:
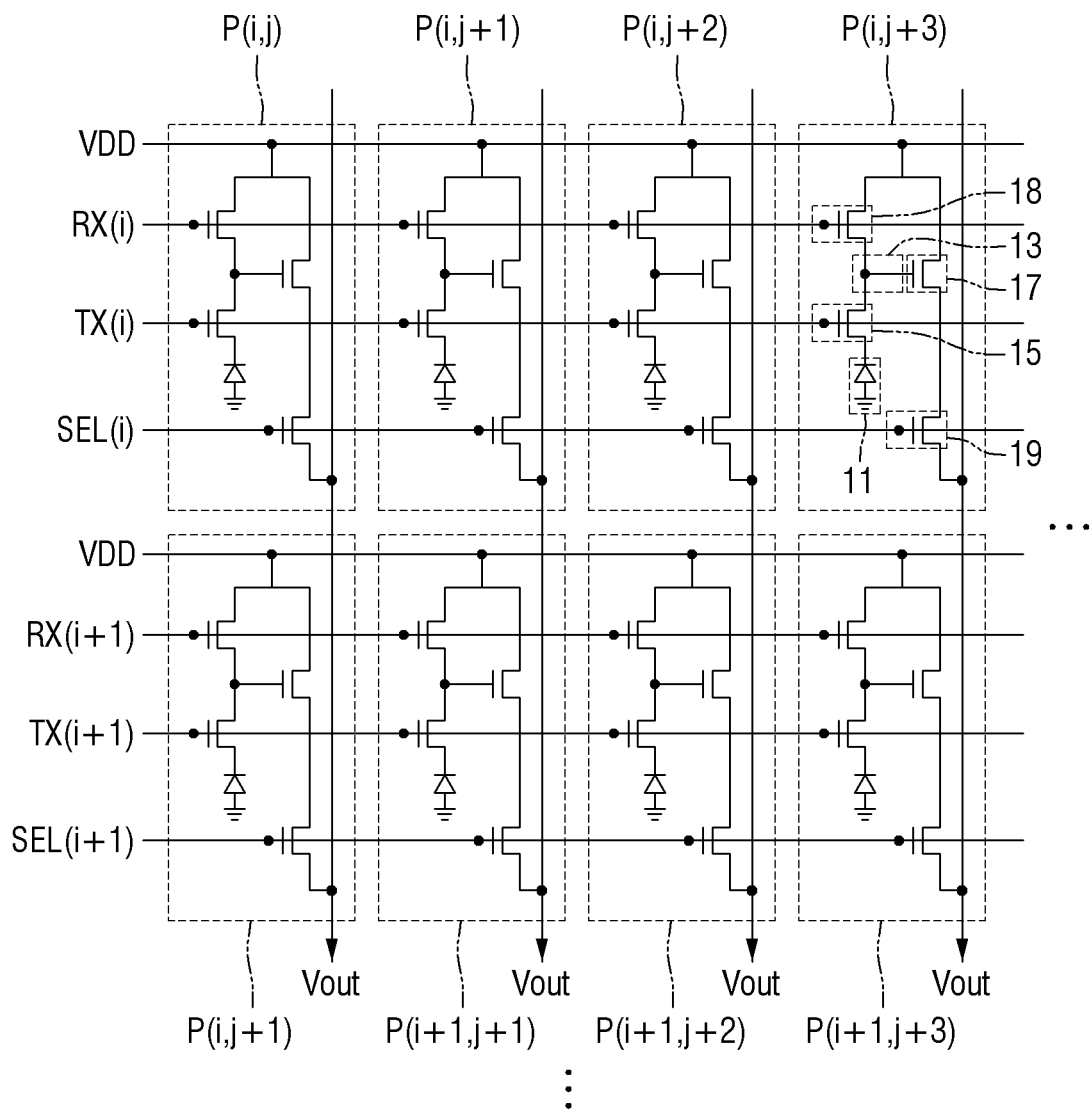
FIG. 2 is an equivalent circuit diagram of a sensor array of FIG. 1.

FIG. 2 is an equivalent circuit diagram of the sensor array of FIG. 1.

Referring to FIG. 2, pixels P may be arranged in a matrix form to construct or define the active pixel sensor array 10. Each of the pixels P includes a photoelectric conversion element 11, a floating diffusion region 13, a charge transfer element 15, a drive element 17, a reset element 18, and a selection element 19. These functions will be described with reference to i-th row pixel (P(i, j), P(i, j+1), P(i, j+2), P(i, j+3), . . . ) as an example.

The photoelectric conversion element 11 may absorb incident light and accumulate charges corresponding to a quantity of light. For the photoelectric conversion element 11, photodiode, phototransistor, photogate, pinned photodiode or a combination thereof may be used or applied, although the photodiode is illustrated in the drawings as an example.

Each of the photoelectric conversion elements 11 may be coupled with each of the charge transfer elements 15 that transfer the accumulated charges to the floating diffusion region 13.

The floating diffusion region (FD) 13 is a region where the charges are converted into voltages, and because of the parasitic capacitance, the charges may be accumulatively stored.

The drive element 17, exemplified herein as a source follower amplifier, may amplify a change in the electrical potential in the floating diffusion region 13 transferred with the accumulated charges of each of the photoelectric conversion elements 11, and output the amplified result to an output line Vout.

The reset element 18 may periodically reset the floating diffusion region 13. The reset element 18 may be composed of one MOS transistor that is driven by the bias provided by a reset line RX(i) for applying a predetermined bias (i.e., reset signal).

When the reset element 18 is turned on by the bias provided by the reset line RX(i), a predetermined electrical potential provided to a drain of the reset element 18, e.g., a power voltage VDD, may be transmitted to the floating diffusion region 13.

The selection element 19 may perform a function of selecting a pixel P to read in a row unit. The selection element 19 may be composed of one MOS transistor that is driven by the bias (i.e., row select signal) provided by the row select line SEL(i).

When the selection element 19 is turned on by the bias provided by the row select line SEL(i), a predetermined electrical potential provided to a drain of the selection element 19, e.g., a power voltage VDD, may be transmitted to the drain region of the drive element 17.

A transfer line TX(i) to apply the bias to the charge transfer element 15, the reset line RX(i) to apply the bias to the reset element 18, and the row select line SEL(i) to apply the bias to the selection element 19 may be arranged to extend substantially in parallel with each other in a row direction.

Hereinbelow, an image sensor according to some example embodiments will be described with reference to FIG. 3 and FIG. 4.

Figure 3:
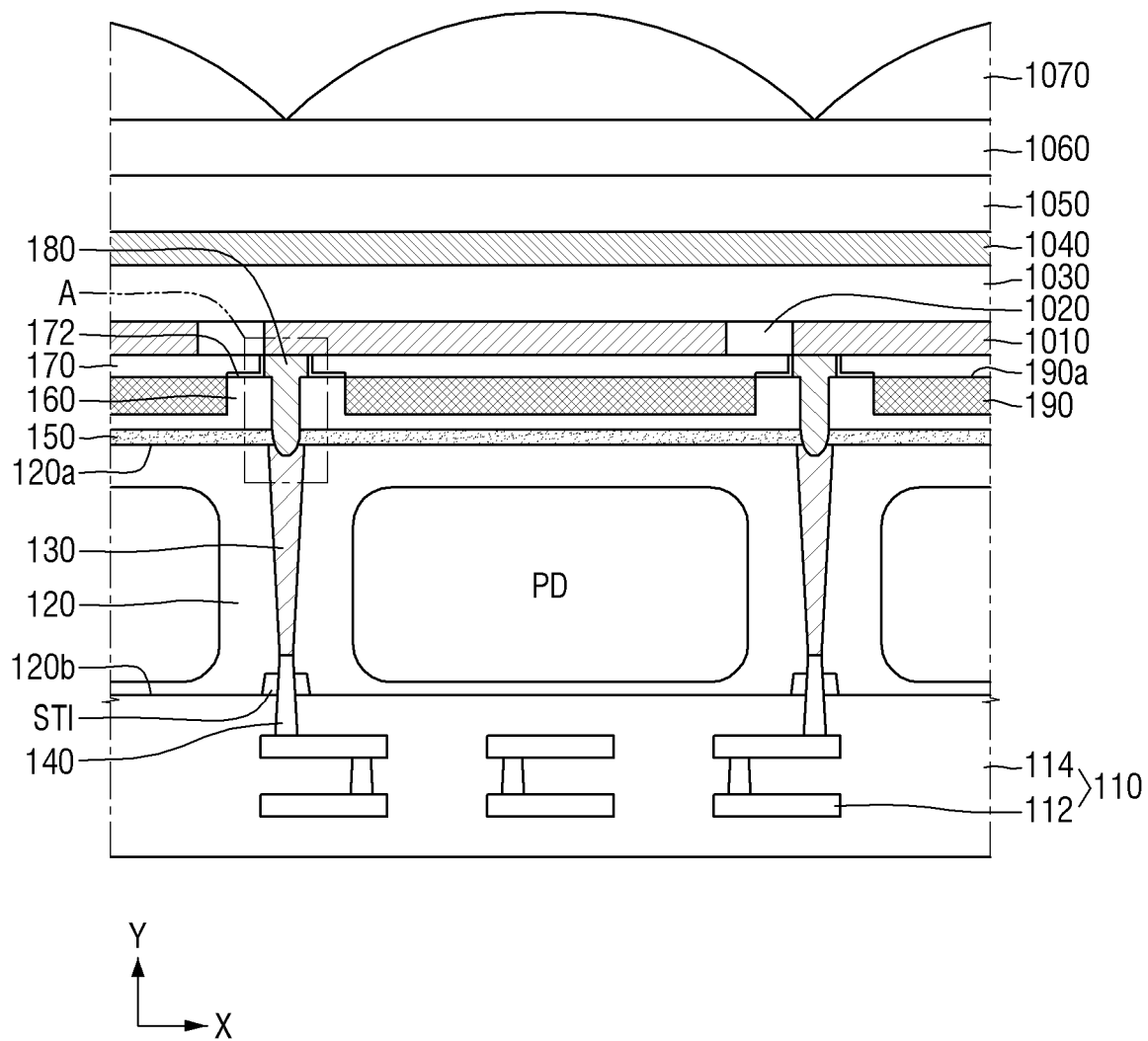
FIG. 3 is a cross-sectional view provided to explain an image sensor according to some example embodiments.

FIG. 3 is cross-sectional view illustrating an image sensor according to some example embodiments. FIG. 4 is an enlarged view of section A of FIG. 3.

Figure 4:
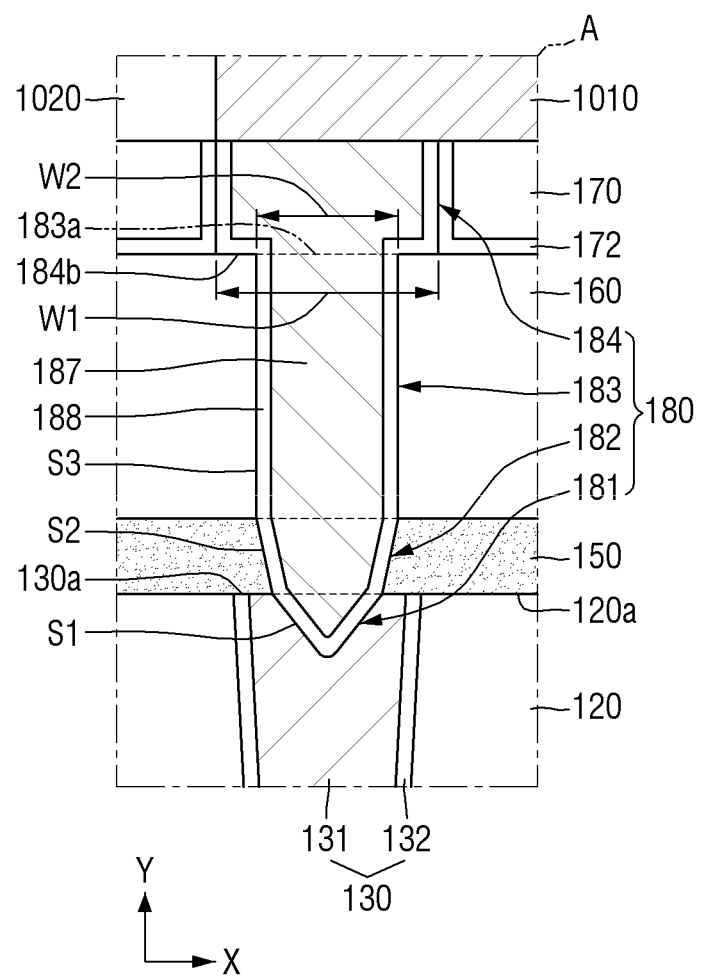
FIG. 4 is an enlarged cross-sectional view enlarging a section A of FIG. 3.

Referring to FIG. 3 and FIG. 4, the image sensor according to some example embodiments includes a photoelectric conversion element (PD), a isolation film (STI), an insulating structure 110, a substrate 120, a first via 130, a second via 140, a first insulating film 150, a second insulating film 160, a third insulating film 170, a contact 180, a color filter 190, a lower electrode 1010, a fourth insulating film 1020, a photo-converting layer 1030, an upper electrode 1040, a fifth insulating film 1050, a planarization film 1060, and a micro lens 1070.

The substrate 120 includes a first surface 120a, which is an upper surface, and a second surface 120b opposing the first surface 120a, which is a lower surface.

For example, the substrate 120 may use a P-type or an N-type bulk substrate, or may use a P-type or an N-type epitaxial layer grown on the P-type bulk substrate, or may use a P-type or an N-type epitaxial layer grown on the N-type bulk substrate. Further, a substrate other than a semiconductor substrate, such as an organic plastic substrate and so on, may also be used for the substrate 120. The photoelectric conversion element (PD), e.g., the photodiode, may be disposed within the substrate 120.

The insulating structure 110 may be disposed on the second surface 120b of the substrate 120. The insulating structure 110 may include a wire layer 112 and an interlayer insulating film 114 disposed to wrap the wire layer 112.

The interlayer insulating film 114 may include, for example, silicon oxide (SiO$_2$), silicon nitride (SiN), and silicon oxynitride (SiON), a low-k dielectric material, or combinations thereof.

The wire layer 112 may include a plurality of metal wires and a plurality of vias to electrically connect metal wires.

For example, the wire layer 112 may include aluminum (Al), copper (Cu), tungsten (W), cobalt (Co), ruthenium (Ru), and so on, but the present disclosure is not limited thereto.

The wire layer 112 may include a plurality of wires stacked sequentially and a plurality of vias to electrically connect wires. Although it is illustrated in FIG. 3 that the wire layer 112 includes two layers stacked sequentially, this is only for convenience of explanation, and thus the present disclosure is not limited thereto.

The first via 130 may be disposed to extend within the substrate 120 after penetrating through the first surface 120a of the substrate 120 in a second direction Y. A first upper surface 130a of the first via 130 may be exposed on or adjacent the first surface 120a of the substrate 120. For example, as shown in FIGS. 3 and 4, the first upper surface 130a of the first via 130 is coplanar with the first surface 120a of the substrate 120. As used herein, an element or surface that is "exposed" on or adjacent another surface does not require the absence of additional layers thereon. A second upper surface of the first via 130 extends away from the first surface 120a of the substrate 120 (e.g., towards the second surface 120b of the substrate 120).

The first via 130 may include a first via conductive film 131 and a first via barrier film 132.

The first via barrier film 132 may be conformally formed along a sidewall and a bottom surface of a trench formed with the first via 130, e.g., a trench extending into the substrate 120 that defines boundaries of the first via 130. For example, the first via barrier film 132 may include silicon oxide (SiO2), silicon nitride (SiN), silicon oxynitride (SiON), a low-k dielectric material, or combinations thereof.

The first via conductive film 131 may be disposed on the first via barrier film 132 to fill the trench formed with the first via 130. The first via conductive film 131 may include poly silicon (Poly-Si), for example, although the present disclosure is not limited thereto.

According to some further example embodiments, the first via conductive film 131 may include, for example, carbon (C), silver (Ag), cobalt (Co), tantalum (Ta), indium (In), tin (Sn), zinc (Zn), manganese (Mn), titanium (Ti), magnesium (Mg), chromium (Cr), germanium (Ge), strontium (Sr), platinum (Pt), magnesium (Mg), aluminum (Al), and/or zirconium (Zr).

The second via 140 may be disposed to extend within the substrate 120 after penetrating through a portion of the interlayer insulating film 114 and the second surface 120b of the substrate 120 in the second direction Y. The second via 140 may be disposed to be in contact with the first via 130 and the wire layer 112, and may electrically connect the first via 130 and the wire layer 112.

The second via 140 may include a second via conductive film and a second via barrier film, similar to the first via 130.

The isolation film (STI) may be disposed to extend within the substrate 120 from the second surface 120b of the substrate 120. The isolation film (STI) may be disposed to wrap or extend around a sidewall of the second via 140. However, the present disclosure is not limited thereto.

For example, the isolation film (STI) may include silicon oxide (SiO$_2$), silicon nitride (SiN), silicon carbide (SiC), silicon oxycarbide (SiOC), silicon oxynitride (SiON), and/or silicon oxycarbon nitride (SiOCN).

The first insulating film 150 may be disposed on the first surface 120a of the substrate 120. The first insulating film 150 may be conformally disposed on the first surface 120a of the substrate 120, and in contact with the first upper surface 130a of the first via 130.

The first insulating film 150 may include a high-k dielectric material, e.g., hafnium oxide (HfO), but the present disclosure is not limited thereto.

The second insulating film 160 may be disposed on the first insulating film 150. The second insulating film 160 may include a material having different etch selectivity from that of the first insulating film 150.

For example, the second insulating film 160 may include a material having a smaller etch resistance than that of the first insulating film 150. The second insulating film 160 may include tetraethylorthosilicate (TEOS), for example, although the present disclosure is not limited thereto. Respective ones of the first via conductive film 131, the first insulating film 150 and the second insulating film 160 may include different materials.

The third insulating film 170 may be disposed on the second insulating film 160. The third insulating film 170 may include silicon oxide (SiO2), for example, but the present disclosure is not limited thereto.

The contact 180 may be disposed to extend into the second upper surface of the first via 130 after penetrating through the first to third insulating films 150, 160, 170 in the second direction Y. That is, at least part of the contact 180 may be disposed within the first via 130.

The contact 180 may include a contact conductive film 187 and a contact barrier film 188.

The contact barrier film 188 may be conformally formed along a sidewall and a bottom surface of a trench formed with the contact 180, e.g., a trench extending into the insulating layers 150, 160 and the via 130, which defines boundaries of the contact 180.

The contact barrier film 188 may include, for example, one of titanium (Ti), titanium nitride (TiN), tantalum (Ta), tantalum nitride (TaN), tantalum carbonitride (TaCN), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), or combinations thereof.

The contact conductive film 187 may be disposed on the contact barrier film 188 to fill the trench formed with the contact 180.

The contact conductive film 187 may include, for example, titanium (Ti), titanium nitride (TiN), and/or tungsten (W), although the present disclosure is not limited thereto.

That is, according to some further example embodiments, the contact conductive film 187 may include, for example, carbon (C), silver (Ag), cobalt (Co), tantalum (Ta), indium (In), tin (Sn), zinc (Zn), manganese (Mn), magnesium (Mg), chromium (Cr), germanium (Ge), strontium (Sr), platinum (Pt), magnesium (Mg), aluminum (Al), and/or zirconium (Zr).

The contact 180 may include a first portion 181 disposed within the first via 130, a second portion 182 disposed in the first insulating film 150, a third portion 183 disposed in the second insulating film 160, and a fourth portion 184 disposed in the third insulating film 170.

A sidewall of the first portion 181 of the contact 180 has a first slope profile S1, a sidewall of the second portion 182 of the contact 180 has a second slope profile S2, and a sidewall of the third portion 183 of the contact 180 has a third slope profile S3.

The first slope profile S1 of the sidewall in the first portion 181 of the contact 180, the second slope profile S2 of the sidewall in the second portion 182 of the contact 180, and the third slope profile S3 of the sidewall in the third portion 183 of the contact 180 may be formed differently from each other.

Different formation of the first to third slope profiles S1, S2, S3 may be caused from difference in etch resistance between the first insulating film 150, the second insulating film 160 and the first via 130 during formation process of the contact 180. That is, the first to third slope profiles S1, S2, S3 may be formed differently from each other by forming etch resistance of the first via 130 to be greater than that of the first insulating film 150 and etch resistance of the first insulating film 150 to be greater than that of the second insulating film 160.

A width W1 in the first direction X on a lower surface 184b of a fourth portion 184 of the contact 180 may be formed to be greater than a width W2 in the first direction X on an upper surface 183a of the third portion 183 of the contact 180. A portion of the lower surface 184b of the fourth portion 184 is in contact with the second insulating film 160.

Although it is illustrated in FIG. 4 that a lower portion of the first portion 181 of the contact 180 is formed to be protruded sharply, the present disclosure is not limited thereto. That is, according to some further example embodiments, a lower portion of the first portion 181 of the contact 180 may be formed to be flat. Further, according to some further example embodiments, a lower portion of the first portion 181 of the contact 180 may have a curve plane shape, e.g., curved extruded shape.

The color filter 190 may be disposed in the second insulating film 160. The color filter 190 may be disposed to be displaced from the contact 180 in the first direction X.

Further, an upper surface 190a of the color filter 190 may be exposed on the second insulating film 160. That is, an upper surface 190a of the color filter 190 may be formed to be coplanar with an upper surface 183a of the third portion 183 of the contact 180.

A protection film 172 may be disposed between an upper surface of the second insulating film 160 and the third insulating film 170 except for a region exposed with an upper surface 190a of the color filter 190. Further, the protection film 172 may be disposed between a sidewall of the fourth portion 184 of the contact 180 and the third insulating film 170.

The protection film 172 may include, for example, silicon oxide (SiO2), but the present disclosure is not limited thereto.

The lower electrode 1010 may be disposed on the third insulating film 170 and the fourth portion 184 of the contact 180. The lower electrode 1010 may be disposed to be in contact with the fourth portion 184 of the contact 180 and connected electrically with the contact 180.

The lower electrode 1010 may include, for example, a plurality of lower electrodes 1010 which are displaced from each other in the first direction X. Any one lower electrode 1010 electrically connected with a respective contact 180 may be displaced from another lower electrode 1010 electrically connected with an adjacent contact 180 in the first direction X.

The lower electrode 1010 may be a transparent electrode. The lower electrode 1010 may be, for example, indium tin oxide or tin-doped indium oxide (ITO), but the present disclosure is not limited thereto.

The fourth insulating film 1020 may be disposed between a plurality of lower electrodes 1010 which are displaced from each other in the first direction X.

The fourth insulating film 1020 may include, for example, silicon oxide ($SiO_2$), silicon nitride (SiN), silicon oxynitride (SiON), a low-k dielectric material or combinations thereof.

The photo-converting layer 1030 may be disposed to extend on or cover the lower electrode 1010 and the fourth insulating film 1020. The photo-converting layer 1030 may absorb visible light.

The photo-converting layer 1030 may be, for example, organic photoelectric conversion layer. The photo-converting layer 1030 may include, for example, an electron donating organic material and an electron accepting organic material.

The upper electrode 1040 may be disposed on the photo-converting layer 1030. The upper electrode 1040 may be a transparent electrode. The upper electrode 1040 may be, for example, indium tin oxide or tin-doped indium oxide, but the present disclosure is not limited thereto.

The fifth insulating film 1050 may be disposed on the upper electrode 1040. Although it is illustrated in FIG. 3 that the fifth insulating film 1050 is formed as a single film, the present disclosure is not limited thereto.

That is, according to some further example embodiments, the fifth insulating film 1050 may include a plurality of films, e.g., a passivation film and an insulating film disposed on the passivation film.

In this case, the passivation film may include, for example, a high-k dielectric insulating material. At least part of a high-k dielectric material included in the passivation film may have amorphous structure. However, the present disclosure is not limited thereto.

The planarization film 1060 may be disposed on the fifth insulating film 1050. For example, the planarization film 1060 may include silicon oxide film-based material, silicon nitride film-based material, resin, or combinations thereof. Although it is illustrated in FIG. 3 that the planarization film 1060 is formed as a single film, the present disclosure is not limited thereto.

The micro lens 1070 may be disposed on the planarization film 1060 in a convex shape. The visible light passing through the micro lens 1070 may be concentrated on the photo-converting layer 1030.

The micro lens 1070 may include, for example, resin material such as silicon nitride film (SiN), styrene resin, acryl resin, styrene-acryl copolymer resin, siloxane resin, and so on. However, the present disclosure is not limited thereto.

The image sensor according to some example embodiments may secure misalignment margin between the contact 180 and the first via 130 by forming the slope profile S2 of the sidewall of the contact 180 in contact with the first insulating film 150 to be different from the slope profile S3 of the sidewall of the contact 180 in contact with the second insulating film 160 based on or in utilization of etch selectivity of the first insulating film 150 and the second insulating film 160.

Further, resistance may be reduced by increasing contact dimensional size between the contact 180 and the lower electrode 1010 in a way of forming the width W1 of an upper portion 184 of the contact 180 to be greater relatively, e.g., than a width W2 of a lower portion 183.

Further, in the image sensor according to some example embodiments, as a portion of the contact 180 formed on the substrate 120 may extend within the first via 130, resistance may be reduced by increasing contact dimensional size between the contact 180 and the first via 130.

Hereinbelow, a method for fabricating an image sensor according to some example embodiments will be explained with reference to FIG. 3, and FIG. 5 to FIG. 15.

FIG. 5, FIG. 6, FIG. 8, FIG. 10, and FIG. 12 to FIG. 15 are views illustrating intermediate stages of fabrication, provided to explain a method for fabricating an image sensor according to some example embodiments. FIG. 7 is an enlarged view of section B of FIG. 6. FIG. 9 is an enlarged view of section C of FIG. 8. FIG. 11 is an enlarged view of section D of FIG. 10.

Figure 5:
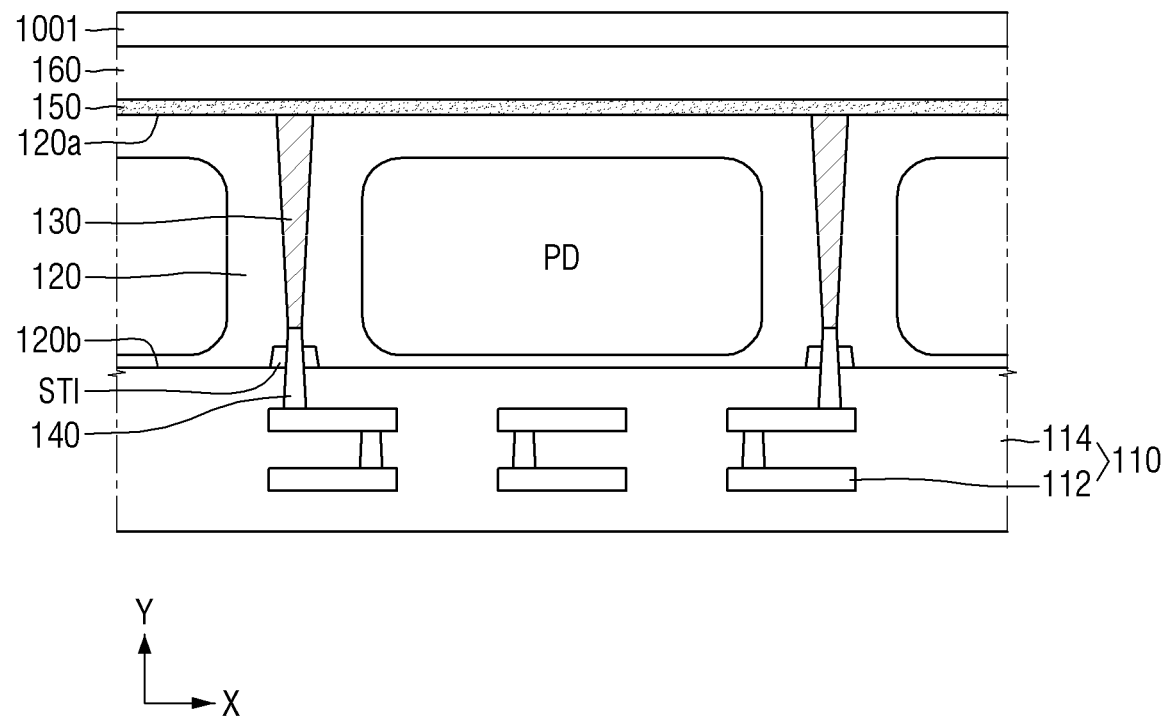
FIG. 5, FIG. 6, FIG. 8, FIG. 10, and FIG. 12 to FIG. 15 are views illustrating intermediate stages of fabrication, provided to explain a method for fabricating an image sensor according to some example embodiments.

Referring to FIG. 5, the insulating structure 110 formed on the substrate 120 and the second surface 120b of the substrate 120 may be provided.

In this case, the substrate 120 may be formed with the photoelectric conversion element (PD), the first via 130, the isolation film (STI), and a portion of the second via 140. Further, the insulating structure 110 may be formed with the interlayer insulating film 114, the wire layer 112, and another portion of the second via 140.

The first insulating film 150, the second insulating film 160 and a mask film 1001 may be sequentially stacked on the first surface 120a of the substrate 120.

The mask film 1001 may include, for example, silicon nitride (SiN), although the present disclosure is not limited thereto.

The first via 130, the first insulating film 150, the second insulating film 160, and the mask film 1001 may have different etch selectivity from each other.

Specifically, etch resistance of the first via 130 may be formed to be greater than that of the first insulating film 150, etch resistance of the first insulating film 150 may be formed to be greater than that of the second insulating film 160, and etch resistance of the second insulating film 160 may be formed to be greater than that of the mask film 1001.

Figure 6:
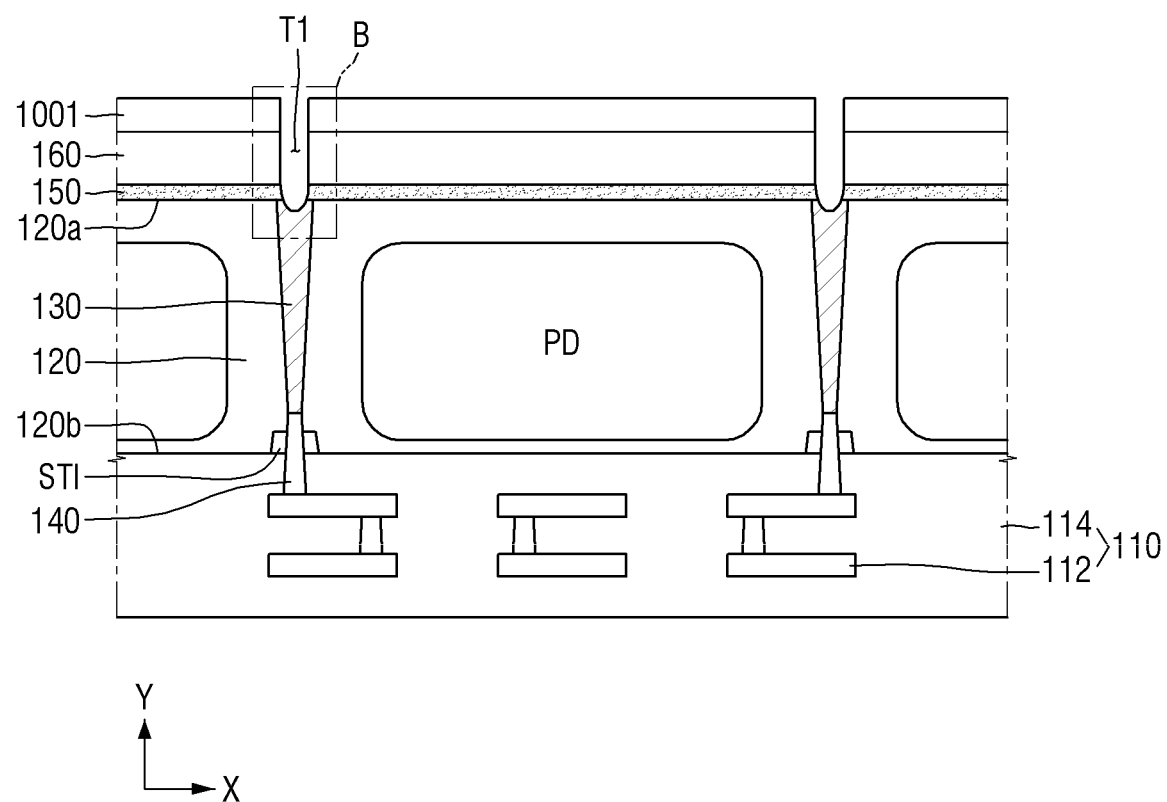
Figure 7:
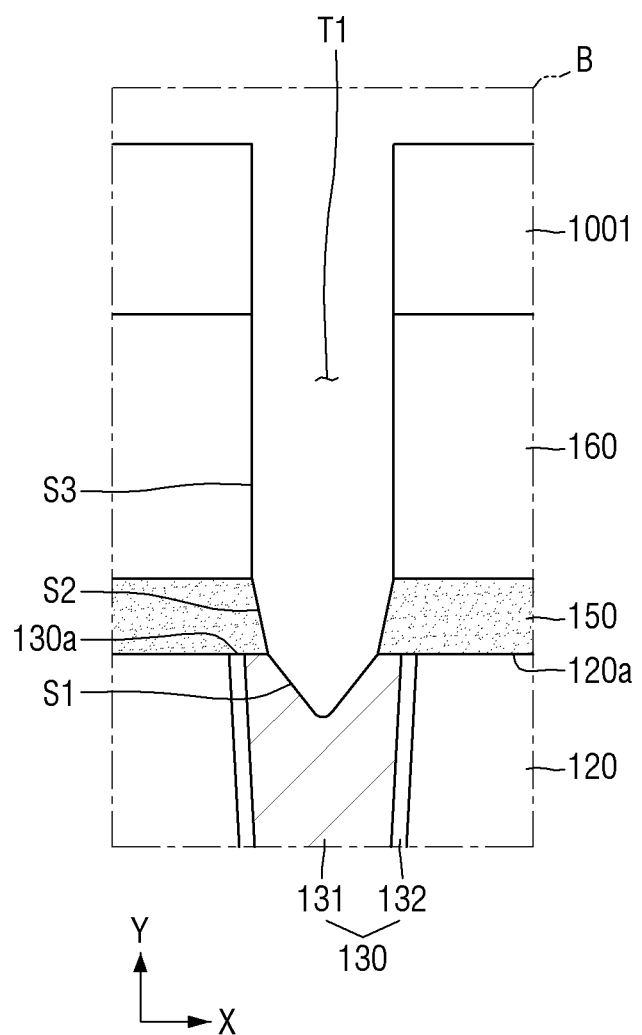
FIG. 7 is an enlarged view of section B of FIG. 6.

Referring to FIG. 6 and FIG. 7, etch fabrication is performed, e.g., to define a first trench T1 penetrating through the first to third insulating films 150, 160, 170 in the second direction Y and having a portion extending within the first via 130.

A first slope profile S1 of a sidewall of the first trench T1 formed on the first via 130, a second slope profile S2 of a sidewall of the first trench T1 formed on the first insulating film 150, and a third slope profile S3 of a sidewall of the first trench T1 formed in the second insulating film 160 may be formed to be different from each other by using different etch selectivity between the first via 130, the first insulating film 150, and the second insulating film 160.

That is, a width of the first trench T1 in the first direction X may become smaller as being nearer to the second surface 120b of the substrate 120. The slope profile of the sidewall of the first trench T1 may be modified at a border line of (or boundary/interface between) the first via 130 and the first insulating film 150, and at a border line of (or boundary/interface between) the first insulating film 150 and the second insulating film 160.

Figure 8:
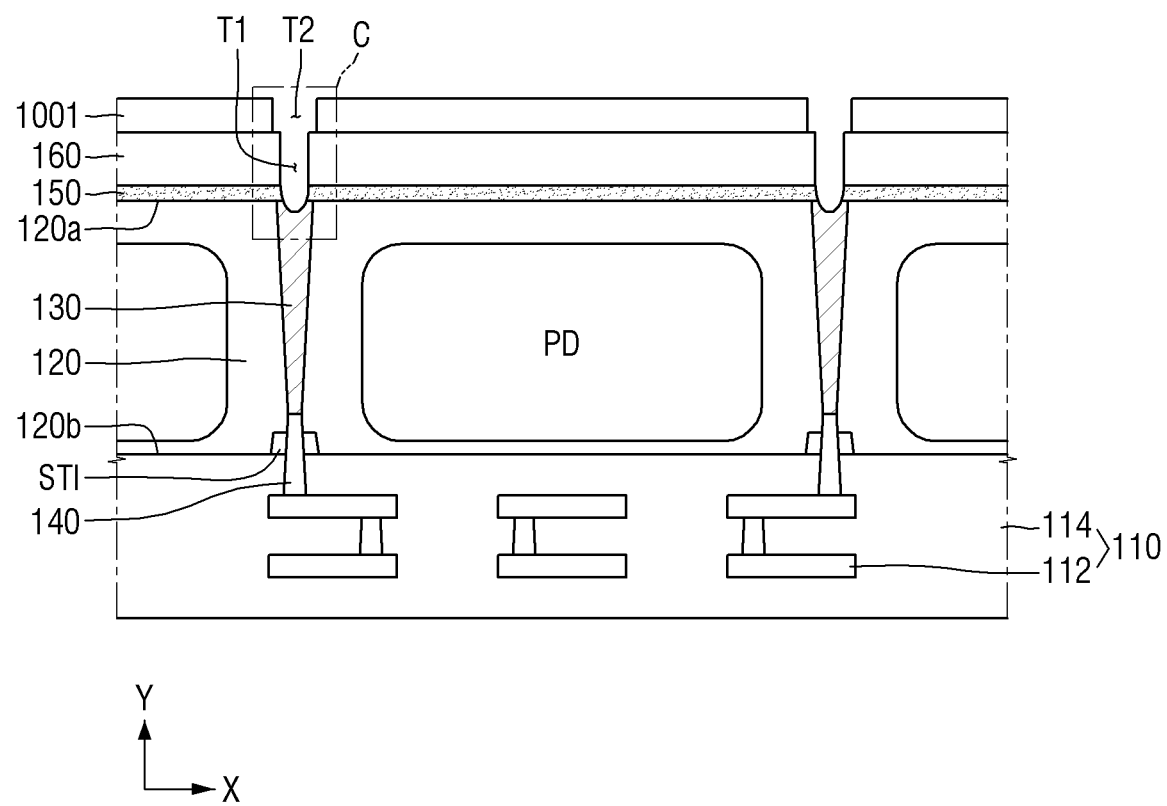
Figure 9:
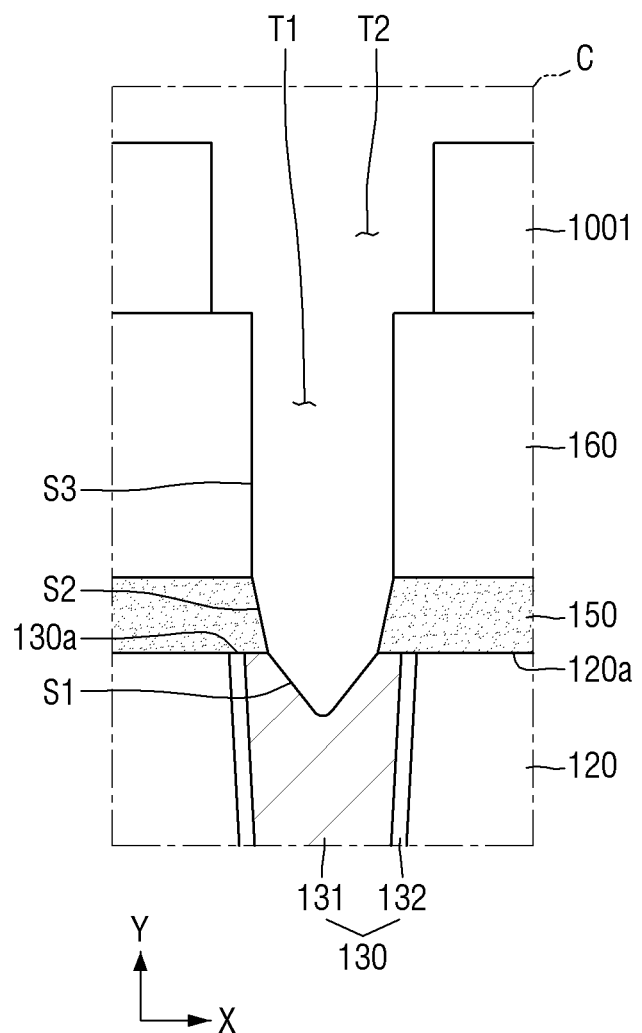
FIG. 9 is an enlarged view of section C of FIG. 8.

Referring to FIG. 8 and FIG. 9, a second trench T2 may be formed within the mask film 1001 by performing additional etching fabrication and etching a sidewall of the mask film 1001 exposed by the first trench T1.

A width of the second trench T2 in the first direction X may be formed to be greater than a width of the first trench T1 in the first direction X by using different etch selectivity between the second insulating film 160 and the mask film 1001.

Figure 10:
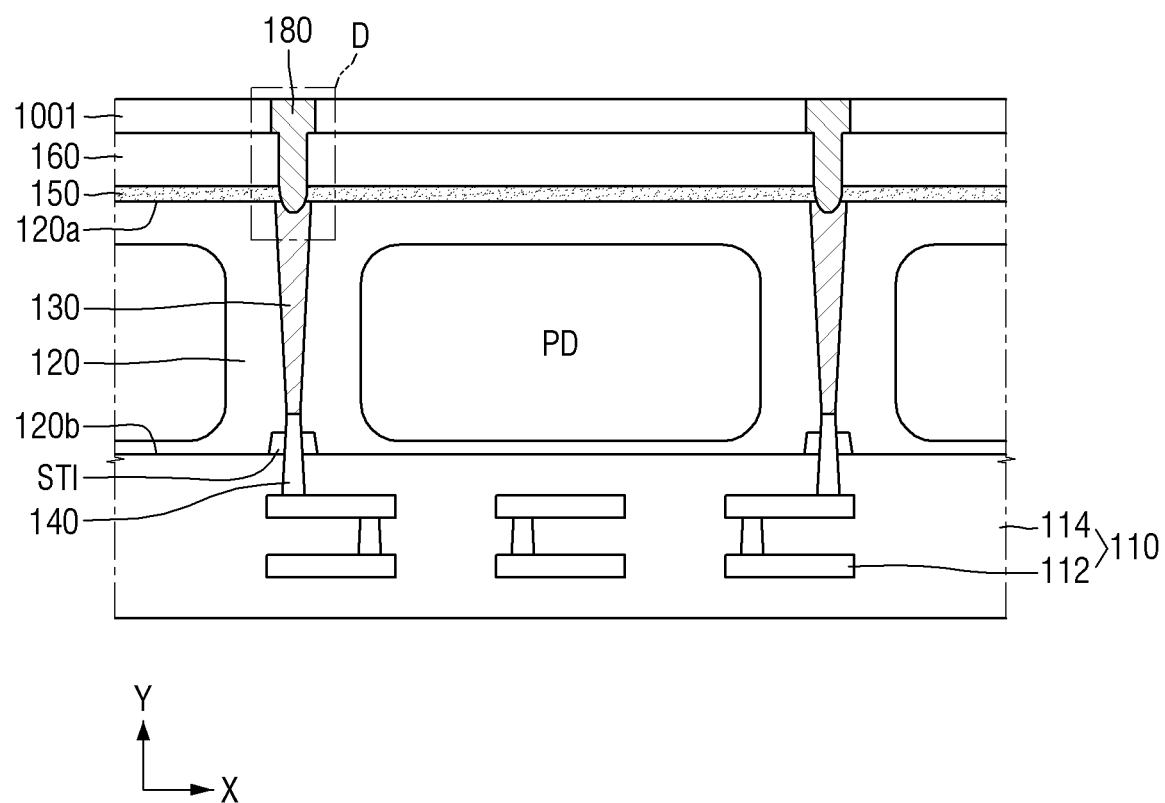
Figure 11:
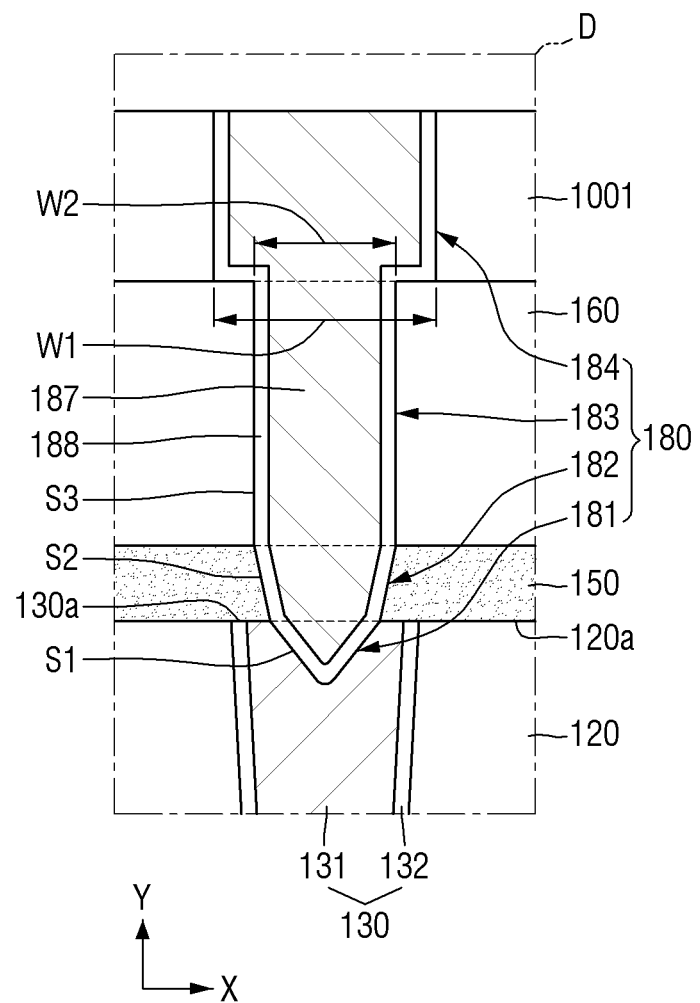
FIG. 11 is an enlarged view of section D of FIG. 10.

Referring to FIG. 10 and FIG. 11, the contact 180 may be formed in the first trench Ti and the second trench T2.

Specifically, the contact barrier film 188 may be conformally formed along a sidewall and a bottom surface of each of the first trench T1 and the second trench T2. The contact conductive film 187 may be formed on the contact barrier film 188 to fill the first trench T1 and the second trench T2.

Figure 12:
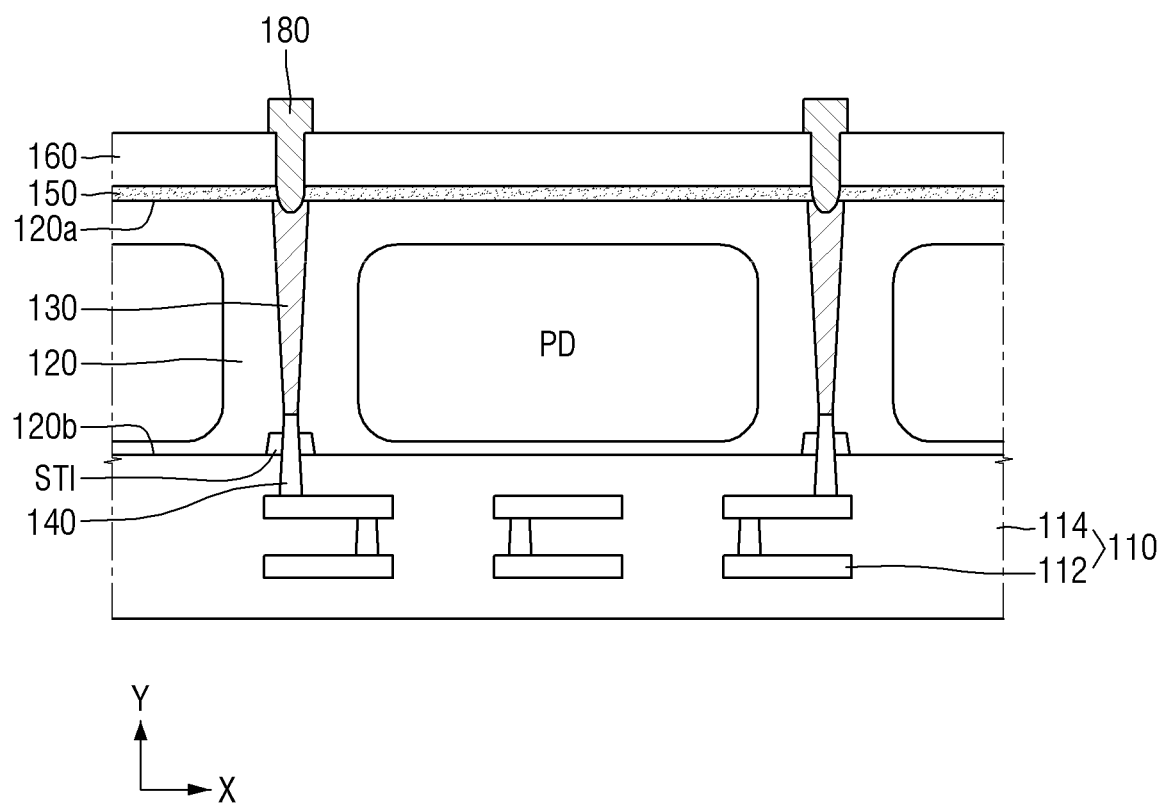
Figure 13:
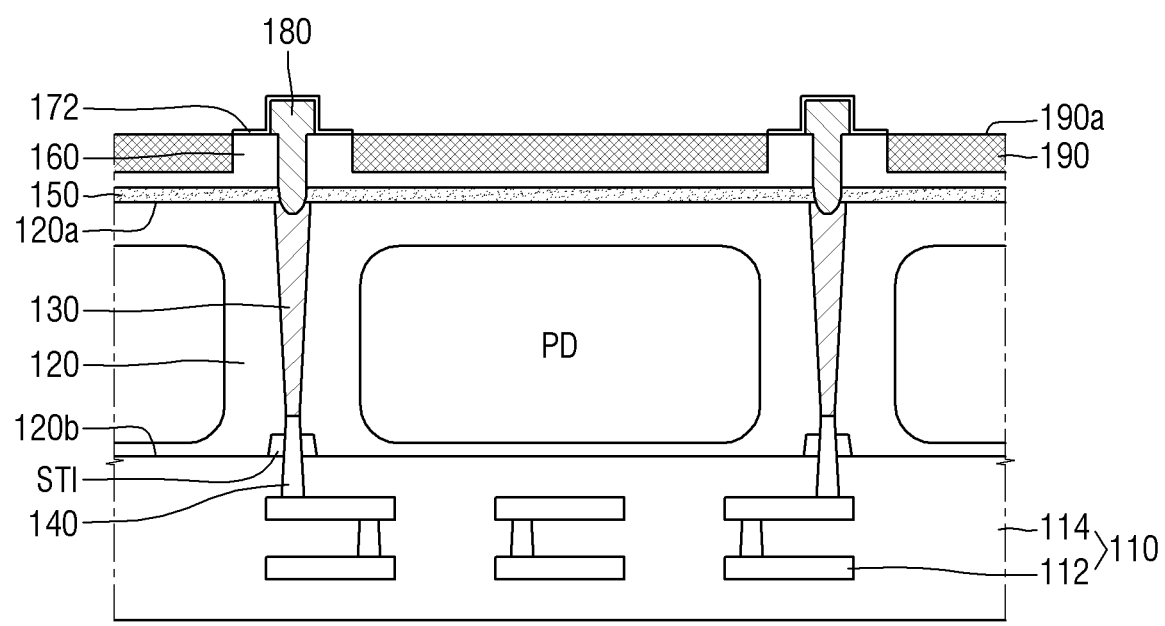

Referring to FIG. 12 and FIG. 13, a protective film 172 (to cover an upper surface of the second insulating film 160 and the exposed contact 180) may be conformally formed after removing the mask film 1001.

Portions of the protective film 172 (other than the portions of the protective film 172 on the contact 180 and on the second insulating film 160 adjacent to the contact 180) may be removed.

The color filter 190 may be formed within the trench formed by performing etch fabrication in portions of the second insulating film 160 (e.g., in portions of the second insulating film 160 that were removed along with the protective film 172). In this case, an upper surface 190a of the color filter 190 may be formed to be coplanar with an upper surface of the second insulating film 160. However, the present disclosure is not limited thereto.

Figure 14:
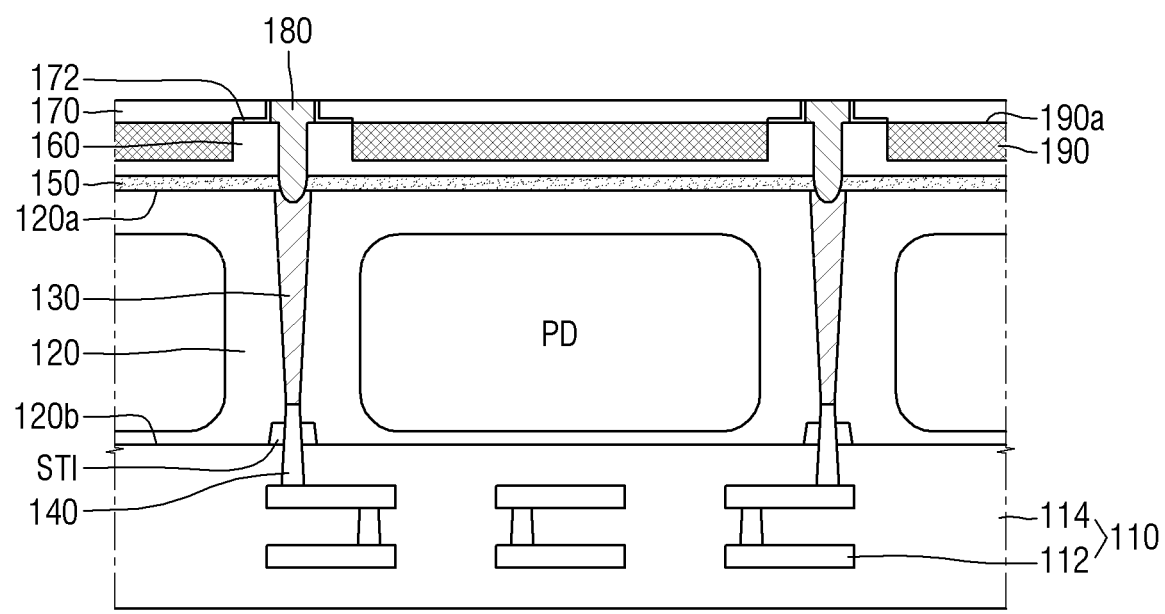
Figure 14:
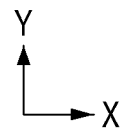

Referring to FIG. 14, the third insulating film 170 may be formed to extend on or cover the protective film 172 and an upper surface 190a of the color filter 190.

An upper surface of the contact 180 may be exposed by etching an upper portion of the third insulating film 170, a portion of the protective film 172 formed on the contact 180 and a portion of an upper portion of the contact 180 through planarization process (CMP process).

Figure 15:
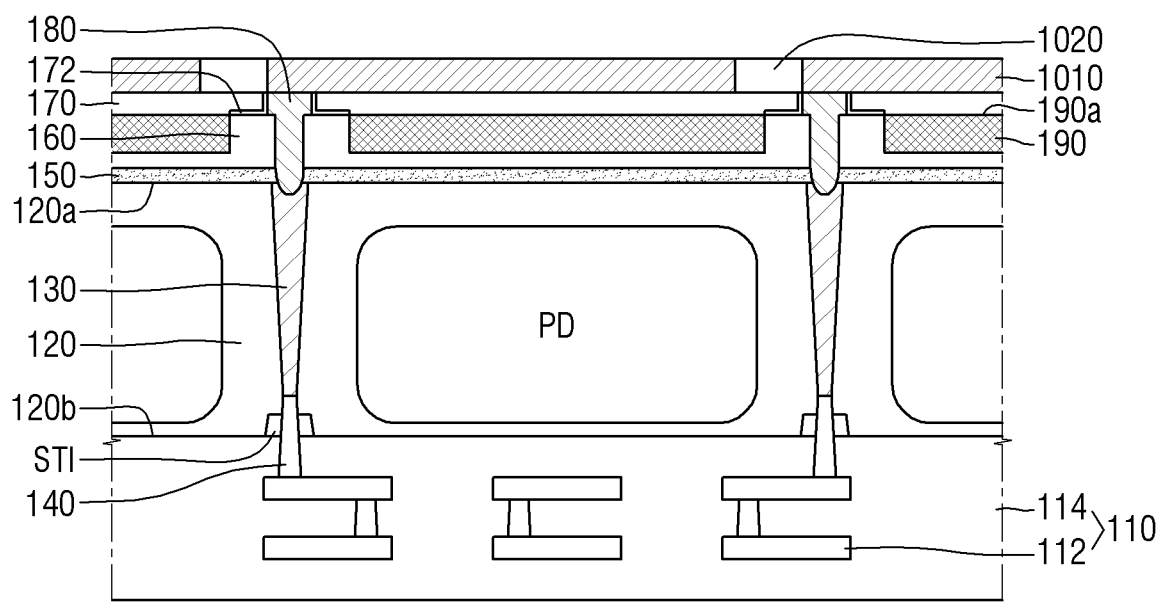
Figure 15:
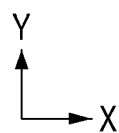

Referring to FIG. 15, the lower electrode 1010 may be formed on the contact 180 and the third insulating film 170 so as to be in contact with the contact 180. Further, a fourth insulating film 1020 may be formed on portions of the third insulating film 170 in which the lower electrode 1010 is not formed. An upper surface of the lower electrode 1010 may be formed to be coplanar with an upper surface of the fourth insulating film 1020.

Referring again to FIG. 3, the photo-converting layer 1030, the upper electrode 1040, the fifth insulating film 1050, the planarization film 1060, and the micro lens 1070 may be sequentially formed on the lower electrode 1010 and the fourth insulating film 1020.

Through the above-described process, the image sensor illustrated in FIG. 3 may be fabricated.

Hereinbelow, an image sensor according to some further example embodiments will be described with reference to FIG. 16. The description will focus on the differences from the image sensor illustrated in FIG. 4.

Figure 16:
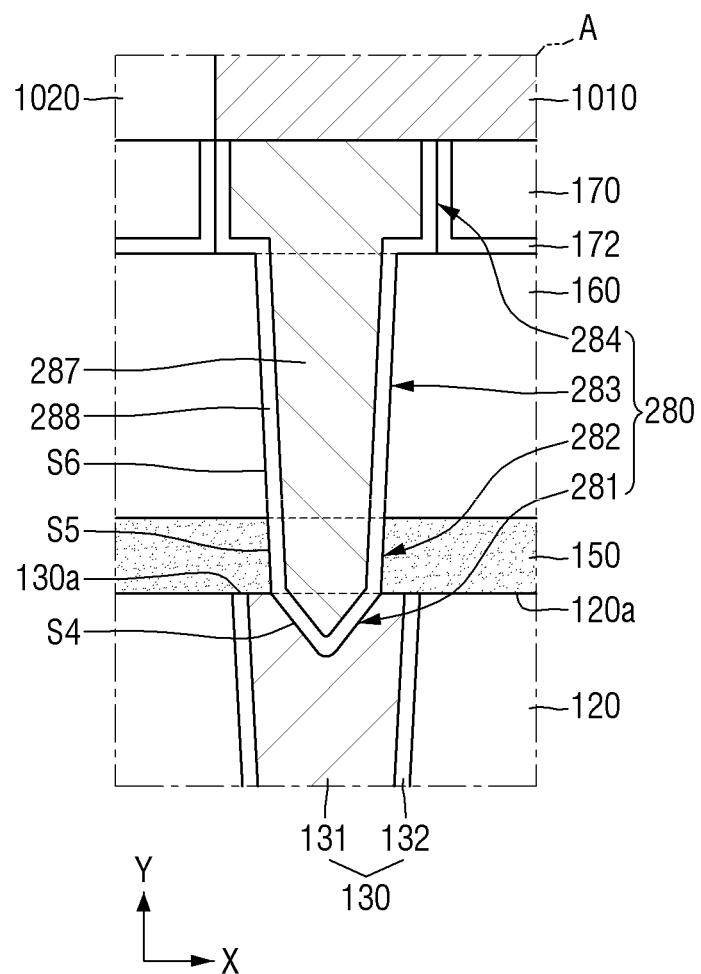
FIG. 16 is cross-sectional view illustrating an image sensor according to some further example embodiments.

FIG. 16 is cross-sectional view illustrating an image sensor according to some further example embodiments.

Referring to FIG. 16, the image sensor according to some further example embodiments may include the contact 280 including a first portion 281 disposed within the first via 130, a second portion 282 disposed in the first insulating film 150, a third portion 283 disposed in the second insulating film 160, and a fourth portion 284 disposed in the third insulating film 170.

The contact 280 may include the contact barrier film 288 formed conformally along a sidewall and a bottom surface of the trench formed with the contact 280 (e.g., a trench in the insulating layers 150, 160 and the via 130, which defines the boundaries of the contact 280) and the contact conductive film 287 disposed on the contact barrier film 288 to fill the trench formed with the contact 280.

A sidewall of the first portion 281 of the contact 280 has a fourth slope profile S4, a sidewall of the second portion 282 of the contact 280 has a fifth slope profile S5, and a sidewall of the third portion 283 of the contact 280 has a sixth slope profile S6.

The fifth slope profile S5 may be formed to be same as the sixth slope profile S6. The fourth slope profile S4 may be formed to be different from the fifth slope profile S5 and the sixth slope profile S6.

Hereinbelow, an image sensor according to some further example embodiments will be described with reference to FIG. 17. The description will focus on the differences from the image sensor illustrated in FIG. 4.

Figure 17:
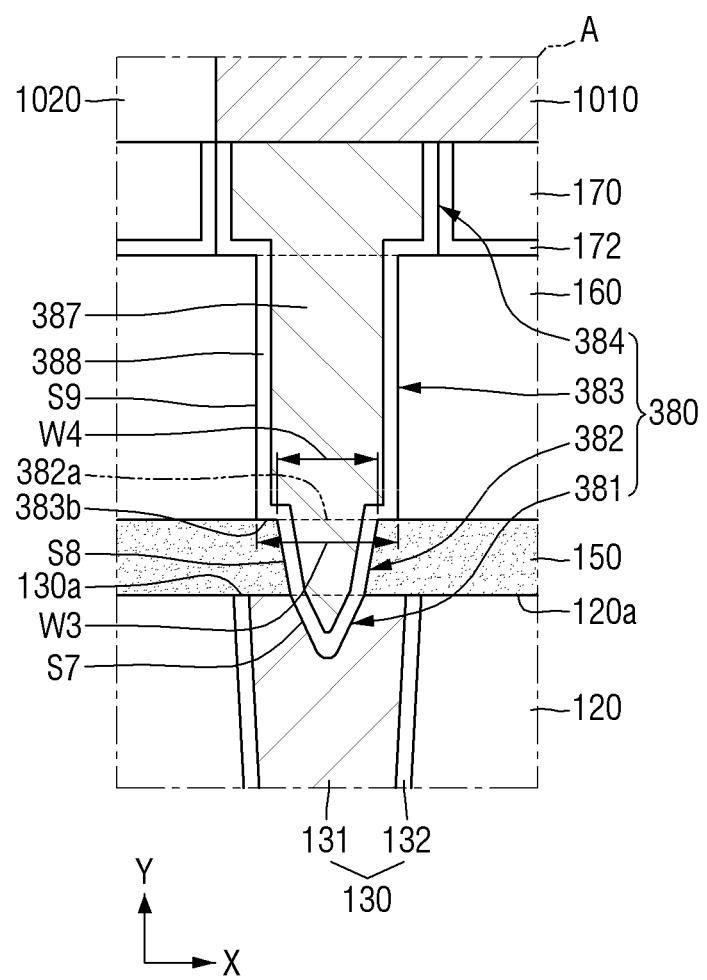
FIG. 17 is cross-sectional view illustrating an image sensor according to some further example embodiments.

FIG. 17 is cross-sectional view illustrating an image sensor according to some further example embodiments.

Referring to FIG. 17, the image sensor according to some further example embodiments may include the contact 380 including a first portion 381 disposed within the first via 130, a second portion 382 disposed in the first insulating film 150, a third portion 383 disposed in the second insulating film 160, and a fourth portion 384 disposed in the third insulating film 170.

The contact 380 may include the contact barrier film 388 formed conformally along a sidewall and a bottom surface of the trench formed with the contact 380 (e.g., a trench in the insulating layers 150, 160 and the via 130, which defines the boundaries of the contact 380) and the contact conductive film 387 disposed on the contact barrier film 388 to fill the trench formed with the contact 380.

A sidewall of the first portion 381 of the contact 380 has a seventh slope profile S7, a sidewall of the second portion 382 of the contact 380 has an eighth slope profile S8, and a sidewall of the third portion 383 of the contact 380 has a ninth slope profile S9.

A width W3 in the first direction X on a lower surface 383b of the third portion 383 of the contact 380 may be formed to be greater than a width W4 in the first direction X on an upper surface 382a of the second portion 382 of the contact 380.

Hereinbelow, an image sensor according to some further example embodiments will be described with reference to FIG. 18. The description will focus on the differences from the image sensor illustrated in FIG. 3.

Figure 18:
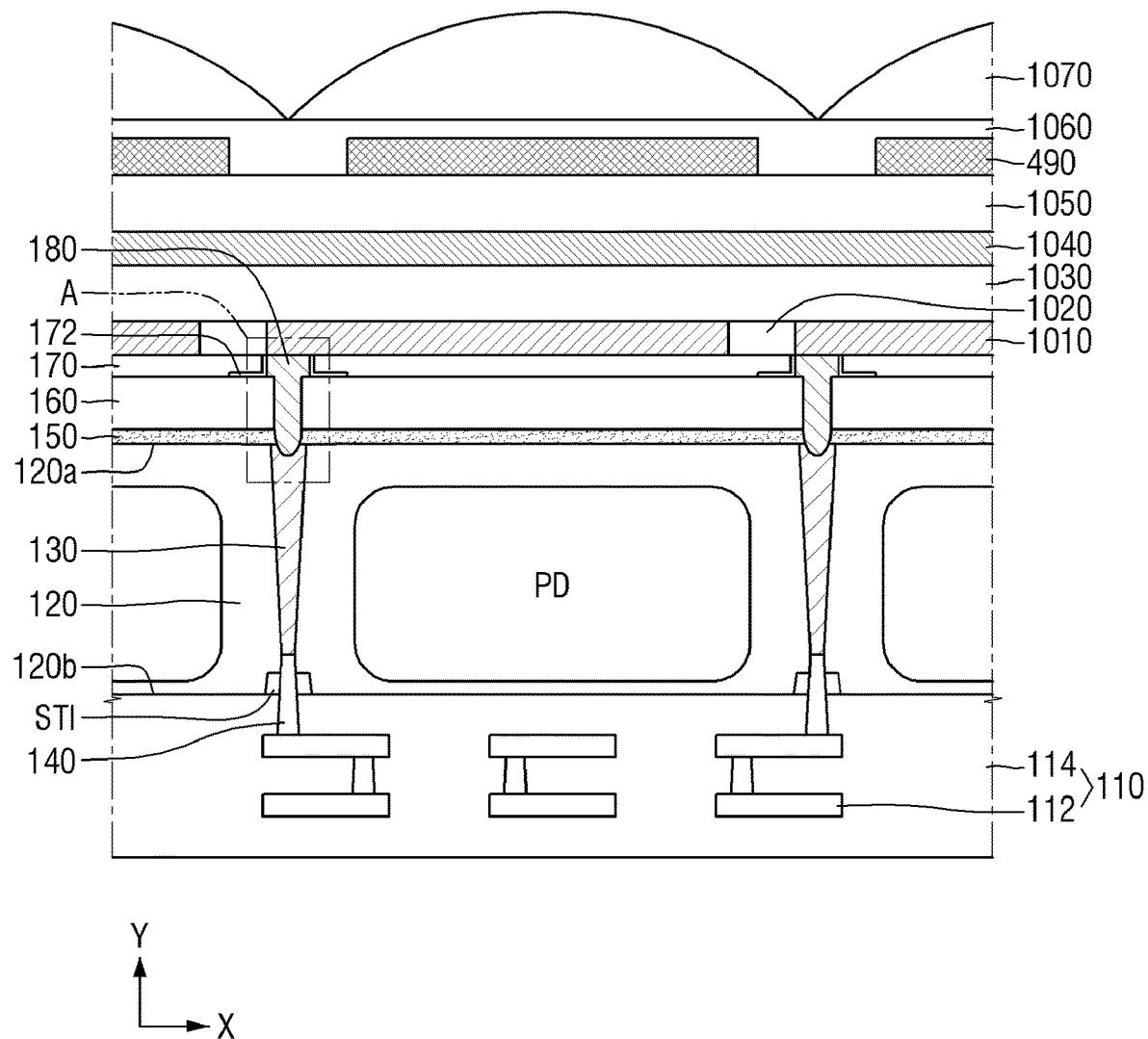
FIG. 18 is cross-sectional view illustrating an image sensor according to some further example embodiments.

FIG. 18 is cross-sectional view illustrating an image sensor according to some further example embodiments.

Referring to FIG. 18, in the image sensor according to some further example embodiments, the color filter 490 may be disposed in the planarization film 1060 without or rather than being disposed in the second insulating film 160. That is, the color filter 490 may be disposed on the fifth insulating film 1050, and the planarization film 1060 may be disposed to extend on or cover the color filter 490.

Hereinbelow, an image sensor according to some further example embodiments will be described with reference to FIG. 18 and FIG. 17. The description will focus on differences from the image sensor illustrated in FIG. 3 and FIG. 4.

Hereinbelow, FIG. 17 is an enlarged view of region A of FIG. 18.

Referring to FIG. 18 and FIG. 17, in the image sensor according to some further example embodiments, the color filter 490 may not be disposed on the second insulating film 160 and may be disposed in the planarization film 1060. That is, the color filter 490 may be disposed on the fifth insulating film 1050, and the planarization film 1060 may be disposed to extend on or cover the color filter 490.

Further, a width W3 in the first direction X on a lower surface 383b of the third portion 383 of the contact 380 may be formed to be greater than a width W4 in the first direction X on an upper surface 382a of the second portion 382 of the contact 380. More generally, although embodiments herein are described with reference to particular examples of contact shapes and image sensor arrangements, it will be understood that the various contact shapes can be used with any of the image sensor arrangements described herein.

Example embodiments according to the present disclosure were explained hereinabove with reference to the drawings attached, but it should be understood that the present disclosure is not limited to the aforementioned example embodiments, but may be fabricated in various different forms, and may be implemented by a person skilled in the art in other specific forms without altering the technical concept or characteristics of the present disclosure. Accordingly, it will be understood that the example embodiments described above are only illustrative, and should not be construed as limiting.

What is claimed is:

1. An image sensor, comprising:
   a substrate comprising a photoelectric conversion element therein;
   a first via extending into a first surface of the substrate, wherein a first upper surface of the first via is exposed adjacent the first surface of the substrate, and a second upper surface of the first via extends away from the first surface of the substrate;
   first, second, and third insulating films sequentially stacked on the first surface of the substrate, wherein the first insulating film is in contact with the first upper surface of the first via and the first surface of the substrate along a first interface between the substrate and the first insulating film; and
   a contact extending through the first, second, and third insulating films and into the second upper surface of the first via, the contact comprising a first portion within the first via, a second portion in the first insulating film, a third portion in the second insulating film, and a fourth portion in the third insulating film,
   wherein a first slope profile of a sidewall of the first portion that is within the first via is different from a second slope profile of a sidewall of the second portion that is in contact with the first insulating film.

2. The image sensor of claim 1, further comprising:
   a color filter in the second insulating film.

3. The image sensor of claim 2, wherein an upper surface of the color filter is coplanar with a surface of the third portion of the contact.

4. The image sensor of claim 1, further comprising:
   a color filter on the third insulating film.

5. The image sensor of claim 1, wherein the first via is confined below the first interface, and wherein the first upper surface of the first via is coplanar with the first surface of the substrate.

6. The image sensor of claim 5, wherein:
   the first via, the first insulating film and the second insulating film respectively include different materials;
   a third slope profile of a sidewall of the third portion in contact with the second insulating film is different from the first slope profile and the second slope profile;
   the first slope profile transitions to the second slope profile at the first interface;

the second slope profile transitions to the third slope profile at a second interface between the first insulating film and the second insulating film; and the second slope profile is continuous between the first slope profile and the third slope profile.

7. The image sensor of claim 1, wherein a first width of a lower surface of the fourth portion is greater than a second width of an upper surface of the third portion.

8. The image sensor of claim 1, wherein a third width of a lower surface of the third portion is greater than a fourth width of an upper surface of the second portion.

9. The image sensor of claim 1, further comprising:
a second via extending into a second surface opposing the first surface of the substrate and electrically connected with the first via.

10. The image sensor of claim 9, further comprising:
an insulating structure on the second surface of the substrate and comprising a wire layer therewithin, wherein the second via is electrically connected with the wire layer.

11. An image sensor, comprising:
a substrate comprising a photoelectric conversion element therein;
a via extending into a first surface of the substrate, wherein a first upper surface of the via is exposed adjacent the first surface of the substrate, and a second upper surface of the via extends away from the first surface of the substrate;
first and second insulating films sequentially stacked on the first surface of the substrate, wherein the first insulating film is in contact with the first upper surface of the via and the first surface of the substrate along a first interface between the substrate and the first insulating film; and
a contact extending through the first and second insulating films and into the second upper surface of the via, the contact comprising a first portion within the via, a second portion in the first insulating film, and a third portion in the second insulating film,
wherein a first slope profile of a sidewall of the first portion that is within the via is different from a second slope profile of a sidewall of the second portion that is in contact with the first insulating film.

12. The image sensor of claim 11, further comprising:
a third insulating film on the second insulating film, wherein the first upper surface of the via is coplanar with the first surface of the substrate, wherein the contact extends through the third insulating film and further comprises a fourth portion in the third insulating film, and
wherein a first width of a lower surface of the fourth portion is greater than a second width of an upper surface of the third portion.

13. The image sensor of claim 11, wherein a third width of a lower surface of the third portion is greater than a fourth width of an upper surface of the second portion.

14. The image sensor of claim 11, further comprising:
a color filter in the second insulating film.

15. The image sensor of claim 11, further comprising:
a third insulating film on the second insulating film; and
a color filter on the third insulating film.

16. The image sensor of claim 11, wherein:
the first insulating film and the second insulating film include different materials;
a third slope profile of a sidewall of the third portion in contact with the second insulating film is different from the first slope profile and the second slope profile;
the first slope profile transitions to the second slope profile at the first interface;
the second slope profile transitions to the third slope profile at a second interface between the first insulating film and the second insulating film; and
the second slope profile is continuous between the first slope profile and the third slope profile.

17. An image sensor, comprising:
a substrate comprising a photoelectric conversion element therein;
a via extending into a first surface of the substrate, wherein a first upper surface of the via is exposed adjacent the first surface of the substrate, and a second upper surface of the via extends away from the first surface of the substrate;
first and second insulating films sequentially stacked on the first surface of the substrate;
a color filter in the second insulating film; and
a contact extending through the first and second insulating films and into the second upper surface of the via, the contact comprising a first portion within the via, a second portion in the first insulating film, a third portion in the second insulating film, and a fourth portion on the second insulating film,
wherein a portion of a lower surface of the fourth portion is in contact with the second insulating film,
wherein the first insulating film is in contact with the first upper surface of the via and the first surface of the substrate along a first interface between the substrate and the first insulating film, and
wherein a first slope profile of a sidewall of the first portion that is within the via is different from a second slope profile of a sidewall of the second portion that is in contact with the first insulating film.

18. The image sensor of claim 17, wherein the via is confined below the first interface, and wherein the first upper surface of the via is coplanar with the first surface of the substrate.

19. The image sensor of claim 17, wherein a third slope profile of a sidewall of the third portion is same as the second slope profile of the sidewall of the second portion.

20. The image sensor of claim 17, wherein an upper surface of the color filter is coplanar with the upper surface of the third portion of the contact.

* * * * *